United States Patent
Todo

(10) Patent No.: US 12,421,437 B2
(45) Date of Patent: Sep. 23, 2025

(54) THERMALLY CONDUCTIVE LIQUID COMPOSITION

(71) Applicant: Fuji Polymer Industries Co., Ltd., Nagoya (JP)

(72) Inventor: Shingo Todo, Aichi (JP)

(73) Assignee: Fuji Polymer Industries Co., Ltd., Aichi (JP)

( * ) Notice: Subject to any disclaimer, the term of this patent is extended or adjusted under 35 U.S.C. 154(b) by 621 days.

(21) Appl. No.: 17/799,848

(22) PCT Filed: Jul. 1, 2021

(86) PCT No.: PCT/JP2021/024999
§ 371 (c)(1),
(2) Date: Aug. 15, 2022

(87) PCT Pub. No.: WO2022/130665
PCT Pub. Date: Jun. 23, 2022

(65) Prior Publication Data
US 2023/0087772 A1    Mar. 23, 2023

(30) Foreign Application Priority Data
Dec. 15, 2020   (JP) ................. 2020-207778

(51) Int. Cl.
*C09K 5/14*    (2006.01)
*C08K 13/02*   (2006.01)
(Continued)

(52) U.S. Cl.
CPC ............... *C09K 5/14* (2013.01); *C08K 13/02* (2013.01); *C08K 13/04* (2013.01);
(Continued)

(58) Field of Classification Search
CPC ........ C09K 5/14; C08K 5/5419; C08K 13/02; C08K 13/04; C08K 2201/001
See application file for complete search history.

(56) References Cited

U.S. PATENT DOCUMENTS

| | | |
|---|---|---|
| 2003/0170446 A1 | 9/2003 | Takahashi et al. |
| 2007/0031684 A1* | 2/2007 | Anderson ........... H01L 23/3737 428/447 |

(Continued)

FOREIGN PATENT DOCUMENTS

| | | |
|---|---|---|
| EP | 3 892 685 | 10/2021 |
| JP | 2005-343728 | 12/2005 |

(Continued)

OTHER PUBLICATIONS

Extended European Search Report issued in corresponding European Patent Application No. 21906032.4, Sep. 20, 2023, 9 pages.

(Continued)

*Primary Examiner* — Bijan Ahvazi
(74) *Attorney, Agent, or Firm* — HSML P.C.

(57) ABSTRACT

Provided is a thermally conductive liquid composition containing a matrix resin (A) and thermally conductive inorganic particles (B). The matrix resin (A) accounts for 2 mass % or more and 8 mass % or less and the thermally conductive inorganic particles (B) account for 92 mass % or more and 98 mass % or less relative to 100 mass % of the thermally conductive liquid composition. The thermally conductive inorganic particles (B) include thermally conductive inorganic particles (B1) of 100 μm or more and 500 μm or less and thermally conductive inorganic particles (B2) of 0.01 μm or more and less than 100 μm. In the volume-based cumulative distribution curve, the thermally conductive inorganic particles (B1) account for 25 vol % or more and 50 vol % or less and the thermally conductive inorganic particles (B2) account for 50 vol % or more and 75 vol %

(Continued)

or less relative to 100 vol % of the thermally conductive inorganic particles (B). Thus, the thermally conductive liquid composition has improved fluidity and is smoothly extruded from a discharge orifice of a small diameter while having high thermal conductivity.

8 Claims, 14 Drawing Sheets

(51) Int. Cl.
    *C08K 13/04*     (2006.01)
    *C08K 3/22*     (2006.01)
    *C08K 3/28*     (2006.01)
    *C08K 5/5419*     (2006.01)
    *C08K 7/18*     (2006.01)

(52) U.S. Cl.
    CPC ............... *C08K 2003/2227* (2013.01); *C08K 2003/282* (2013.01); *C08K 5/5419* (2013.01); *C08K 7/18* (2013.01); *C08K 2201/001* (2013.01); *C08K 2201/005* (2013.01)

(56) References Cited

U.S. PATENT DOCUMENTS

| | | | |
|---|---|---|---|
| 2007/0031686 A1 | 2/2007 | Kendall | |
| 2008/0266804 A1 | 10/2008 | Kendall | |
| 2015/0008361 A1* | 1/2015 | Hattori | C09K 5/14 252/78.3 |
| 2018/0358283 A1* | 12/2018 | Zhang | H01L 23/3737 |
| 2019/0292349 A1 | 9/2019 | Ito | |
| 2019/0345291 A1 | 11/2019 | Kato et al. | |
| 2020/0277189 A1* | 9/2020 | Thendie | C01B 21/064 |
| 2021/0017437 A1* | 1/2021 | Suzumura | C08G 77/04 |
| 2021/0147681 A1 | 5/2021 | Hirakawa et al. | |
| 2021/0147739 A1* | 5/2021 | Sugimoto | H01L 23/3737 |
| 2021/0371660 A1 | 12/2021 | Ishida et al. | |

FOREIGN PATENT DOCUMENTS

| | | | | |
|---|---|---|---|---|
| JP | 2005343728 A | * | 12/2005 | ........... C01B 21/064 |
| JP | 3807995 B | | 8/2006 | |
| JP | 2009-503236 | | 1/2009 | |
| JP | 6610429 B | | 11/2019 | |
| JP | 6648837 B | | 2/2020 | |
| JP | 6692512 B | | 5/2020 | |
| JP | 2020-090584 | | 6/2020 | |
| JP | 2020-104078 | | 7/2020 | |
| JP | 2020104078 A | * | 7/2020 | ............... B05C 5/00 |
| JP | 2020-180221 | | 11/2020 | |
| JP | 2020180221 A | * | 11/2020 | ............. C01B 21/07 |
| TW | 202003656 | | 1/2020 | |
| TW | 202024257 | | 7/2020 | |
| WO | 2018/016566 | | 1/2018 | |
| WO | 2018/033992 | | 2/2018 | |
| WO | 2018/079215 | | 5/2018 | |
| WO | 2019/230969 | | 12/2019 | |
| WO | 2020/049817 | | 3/2020 | |
| WO | 2020/133374 | | 7/2020 | |
| WO | 2020/137086 | | 7/2020 | |

OTHER PUBLICATIONS

International Search Report issued in International Application No. PCT/JP2021/024999, Oct. 5, 2021, 5 pages w/ translation.

Office Action issued in corresponding European Patent Application No. 21906032.4., Jul. 24, 2024, 8 pages.

Notice of Reasons for Cancellation issued in corresponding Japanese Patent No. 7012197, Oct. 18, 2022, 47 pages with a partial machine translation.

\* cited by examiner

THERMALLY CONDUCTIVE LIQUID COMPOSITION

TECHNICAL FIELD

The present invention relates to a thermally conductive liquid composition that is suitable to be interposed between a heat generating member and a heat dissipating material of electrical and electronic components or the like.

BACKGROUND ART

With the significant improvement in performance of semiconductors such as CPUs in recent years, the amount of heat generated by them has become extremely large. For this reason, heat dissipating materials are attached to electronic components that generate heat, and a thermally conductive silicone gel or the like is used between heat generating members such as semiconductors and the heat dissipating materials. The thermally conductive silicone gel is required to have high thermal conductivity and stable extrudability from a container, as devices become smaller in size, more sophisticated, and more highly integrated. Patent Document 1 discloses a grease having a thermal conductivity of 3.1 W/mK or less that is prepared by mixing an organopolysiloxane with a thermally conductive filler having an average particle diameter of 0.01 to 200 µm. Patent Document 2 discloses a grease having a thermal conductivity of 2.5 W/mK or more that is prepared by mixing an organopolysiloxane with thermally conductive fillers including coarse powder having an average particle diameter of 15 to 100 µm, medium-sized powder having an average particle diameter of 2 to 11 µm, and fine particles having an average particle diameter of 0.5 to 1 µm. Patent Document 3 discloses a composition that is prepared by mixing an organopolysiloxane with thermally conductive particles having an average particle diameter of 100 µm or less, and the composition loaded in a syringe is extruded from a discharge orifice of 3 to 8 mm in inner diameter.

PRIOR ART DOCUMENTS

Patent Documents

Patent Document 1: WO 2018-079215 A1
Patent Document 2: WO 2018-033992 A1
Patent Document 3: JP 2020-104078 A

DISCLOSURE OF INVENTION

Problem to be Solved by the Invention

The greases of Patent Documents 1 and 2 have low thermal conductivity. The composition of Patent Document 3 has low fluidity as Table 4 showing the results of examples indicates that the composition broke syringes with a discharge orifice of 1 to 2 mm in diameter, and the discharge diameter (inner diameter) needs to be 3 to 8 mm.

To solve the above conventional problem, the present invention provides a thermally conductive liquid composition having improved fluidity and being smoothly extruded from a discharge orifice of a small diameter while having high thermal conductivity.

Means for Solving Problem

A thermally conductive liquid composition of the present invention contains a matrix resin (A) and thermally conductive inorganic particles (B),
wherein the matrix resin (A) accounts for 2% by mass or more and 8% by mass or less and the thermally conductive inorganic particles (B) account for 92% by mass or more and 98% by mass or less relative to 100% by mass of the thermally conductive liquid composition, the thermally conductive inorganic particles (B) include thermally conductive inorganic particles (B1) of 100 µm or more and 500 µm or less and thermally conductive inorganic particles (B2) of 0.01 µm or more and less than 100 µm, and when the thermally conductive inorganic particles (B) are expressed in a volume-based cumulative distribution curve, the thermally conductive inorganic particles (B1) account for 25% by volume or more and 50% by volume or less and the thermally conductive inorganic particles (B2) account for 50% by volume or more and 75% by volume or less relative to 100% by volume of the thermally conductive inorganic particles (B).

Effect of the Invention

With the above configuration, the present invention provides a thermally conductive liquid composition having improved fluidity and being smoothly extruded from a discharge orifice of a small diameter while having high thermal conductivity. Specifically, the thermally conductive liquid composition loaded in a syringe is extrudable in an amount of 0.1 g or more for 100 seconds from a discharge orifice of 2.5 mm in diameter under a discharge pressure of 0.5 MPa at 23° C., without breakage of the syringe.

DESCRIPTION OF THE INVENTION

Figure 1A:
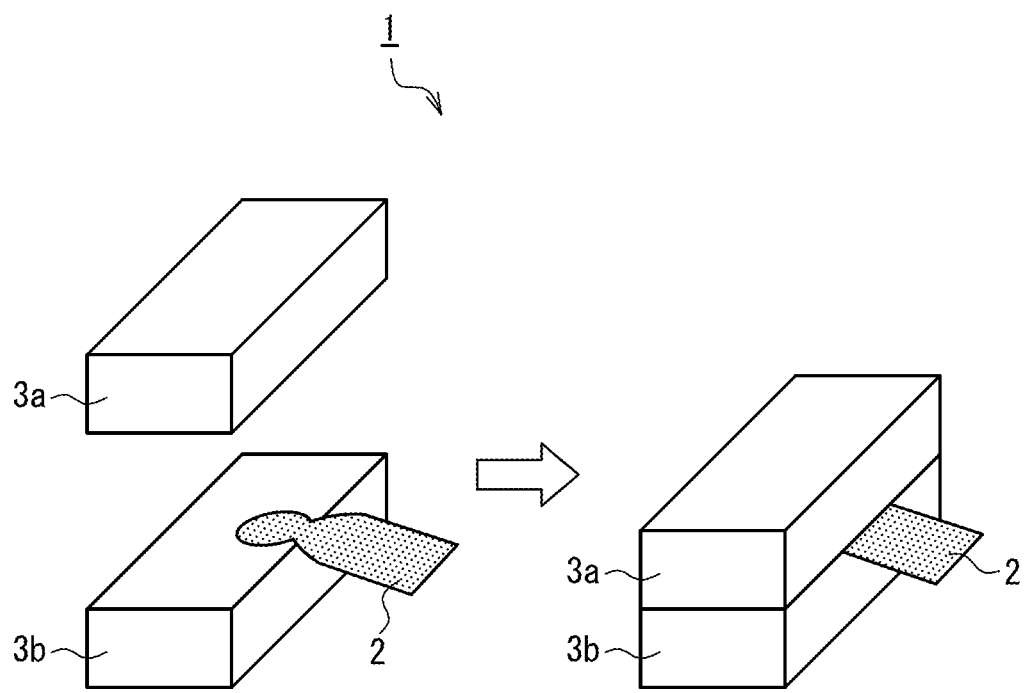
FIGS. 1A and 1B are diagrams illustrating a method for measuring a thermal conductivity of a sample in an example of the present invention.

A thermally conductive liquid composition of the present invention contains a matrix resin (A) and thermally conductive inorganic particles (B). The matrix resin (A) accounts for 2% by mass or more and 8% by mass or less and the thermally conductive inorganic particles (B) account for 92% by mass or more and 98% by mass or less relative to 100% by mass of the thermally conductive liquid composition, and preferably the matrix resin (A) accounts for 3% by mass or more and 7% by mass or less and the thermally conductive inorganic particles (B) account for 93% by mass or more and 97% by mass or less relative to 100% by mass of the thermally conductive liquid composition. The highly packed thermally conductive inorganic particles (B) improve thermal conductivity.

The thermally conductive inorganic particles (B) according to the present invention include thermally conductive inorganic particles (B1) of 100 μm or more and 500 μm or less and thermally conductive inorganic particles (B2) of 0.01 μm or more and less than 100 μm. The thermally conductive inorganic particles (B1) are coarse particles. Using a relatively large amount of the coarse particles and filling the spaces between the coarse particles with the thermally conductive inorganic particles (B2) improve the fluidity of the thermally conductive liquid composition and increase the thermal conductivity. This is a synergistic effect obtained by the highly packed thermally conductive inorganic particles.

When the thermally conductive inorganic particles (B) are expressed in a volume-based cumulative distribution curve, the thermally conductive inorganic particles (B1) account for 25% by volume or more and 50% by volume or less, and preferably 25.5% by volume or more and 47% by volume or less relative to 100% by volume of the thermally conductive inorganic particles (B). The thermally conductive inorganic particles (B2) account for 50% by volume or more and 75% by volume or less, and preferably 53% by volume or more and 74.5% by volume or less relative to 100% by volume of the thermally conductive inorganic particles (B). The cumulative distribution curve is obtained by a particle size distribution measurement according to a laser diffracted light scattering method. An exemplary measuring device is a laser diffraction scattering particle size distribution analyzer LA-950 S2 manufactured by HORIBA, Ltd. When the thermally conductive inorganic particles are composed of particles of different materials, they are separately measured, and the results are combined. In the laser diffracted light scattering method, properties such as a refractive index of a substance are first input to the analyzer before measurement, and hence thermally conductive inorganic particles B containing two or more kinds of substances cannot be measured together.

It is preferred that the thermally conductive liquid composition of the present invention loaded in a syringe is extrudable in an amount of 0.1 g or more for 100 seconds from a discharge orifice of 2.5 mm in diameter under a discharge pressure of 0.5 MPa at 23° C., with no breakage of the syringe. The upper limit of the amount of the composition to be extruded is preferably 150 g or less. For convenience sake, the present invention specifies the diameter of the discharge orifice to 2.5 mm to indicate that the thermally conductive liquid composition of the present invention is fluid enough to flow through a discharge orifice of such a small diameter, and this is not intended to limit the diameter of the discharge orifice. As shown in examples described later, some of thermally conductive liquid compositions are extrudable from discharge orifices of 0.97 mm, 1.43 mm, and 2.27 mm in diameter. The diameter of the discharge orifice as used herein refers to an inner diameter. Thermally conductive liquid compositions extrudable from a discharge orifice of such a small diameter mean that they can be applied with high precision and practically very useful.

The thermal conductivity of the thermally conductive liquid composition is preferably 5.0 to 16.0 W/mK, more preferably 5.5 to 16.0 W/mK, and further preferably 6.0 to 16.0 W/mK. Thermally conductive liquid compositions having a thermal conductivity of this range are useful for various devices.

The thermally conductive inorganic particles (B2) include thermally conductive inorganic particles (B2-1) of 0.8 μm or more and less than 10 μm and thermally conductive inorganic particles (B2-2) of 0.01 μm or more and less than 0.8 μm. When the thermally conductive inorganic particles (B2) are expressed in a volume-based frequency distribution curve, it is preferred that a ratio between the thermally conductive inorganic particles (B2-1) and the thermally conductive inorganic particles (B2-2) determined by Formula (1) below is 40% by volume or more and less than 80% by volume.

$$[(B2\text{-}1)/\{(B2\text{-}1)+(B2\text{-}2)\}]\times 100 \qquad (1)$$

Thus, filling the spaces between the coarse particles (B1) with the thermally conductive inorganic particles (B2-1) and (B2-2) improves the fluidity of the thermally conductive liquid composition and increases the thermal conductivity.

When the thermally conductive inorganic particles (B) are expressed in the volume-based frequency distribution curve, the thermally conductive inorganic particles (B) preferably have one or more peaks in each of the following ranges: from 100 μm or more and 200 μm or less, from 0.8 μm or more and less than 10 μm, and from 0.01 μm or more and less than 0.8 μm. Commercially available thermally conductive inorganic particles, which have different particle distributions and cannot be specified singly by an average particle diameter (median diameter: D50), are preferably specified by a volume-based frequency distribution curve. The frequency distribution curve is obtained in the same manner as the cumulative distribution curve through the particle size distribution measurement according to the laser diffracted light scattering method.

It is preferred that the thermally conductive inorganic particles (B2) further include thermally conductive inorganic particles (B2-3) of 10 μm or more and less than 100 μm, and in the volume-based cumulative distribution curve, the thermally conductive inorganic particles (B2-3) account for 10% by volume or more and less than 35% by volume relative to 100% by volume of the thermally conductive inorganic particles (B). That is, in the volume-based cumulative distribution curve, the heat conductive inorganic particles (B1)+(B2-3) account for 35% by volume or more and less than 85% by volume relative to 100% by volume of the thermally conductive inorganic particles (B), and thus, adding a large amount of thermally conductive inorganic particles of 10 μm or more is preferable.

The thermally conductive liquid composition has a viscosity of preferably 3000 Pas or more at 23° C. according to a rheometer. With this viscosity, the thermally conductive liquid composition is fluid enough to flow through a syringe discharge orifice of a small diameter. The upper limit of the viscosity is preferably 100000 Pas or less. The thermally conductive liquid composition of the present invention has both viscous and elastic characteristics, the viscosity being inherent in the liquid and the elasticity being inherent in the solid. A device called a rheometer is suitable for measuring such "viscoelastic" characteristics. The rheometer evaluates viscoelasticity from a phase difference between a stress and a strain in response to a sinusoidal stress applied, unlike a rotational viscometer or the like in which a unidirectional shear is applied.

The matrix resin is preferably at least one selected from the group consisting of organopolysiloxane, hydrocarbon-based synthetic oil, epoxy resin, phenol resin, unsaturated polyester resin, melamine resin, acrylic resin, and fluorocarbon resin. These resins are useful as the thermally conductive liquid composition. Among them, organopolysiloxane is preferred because the heat resistance is high. The organopolysiloxane may be a commercially available organopolysiloxane and preferably has a viscosity of 100 to 10000 mPa·s. Various types of organopolysiloxanes can be used, including an uncured type and a cured type (e.g., an addition reaction curable type using a platinum-based curing catalyst, a radical reaction curable type using an organic peroxide). When the curing catalyst is (1) an addition reaction catalyst that is a platinum-based metal catalyst, the amount of the addition reaction catalyst is preferably 0.01 to 1000 ppm by mass with respect to the matrix resin component. When the curing catalyst is (2) an organic peroxide catalyst, the amount of the organic peroxide catalyst is preferably 0.1 to 30 parts by mass with respect to 100 parts by mass of the matrix resin component. The composition of a curable type can be formed into a sheet. In this case, the thermally conductive liquid composition is formed into a sheet by rolling, pressing or the like, followed by curing. The cured sheet has a Shore OO hardness of preferably 10 to 80.

The thermally conductive liquid composition may further contain a plasticizer in an amount of more than 0 parts by mass and 200 parts by mass or less with respect to 100 parts by mass of the matrix resin (A). Addition of the plasticizer further improves the fluidity of the thermally conductive liquid composition. The plasticizer preferably contains at least one selected from the group consisting of a silicone oil, a silane coupling agent, and a terminal trialkoxy silicone. An alkyl silane coupling agent preferably contains at least one selected from the group consisting of an alkoxysilane compound expressed by $R_aSi(OR')_{4-a}$ (where R represents a substituted or unsubstituted organic group having 6 to 12 carbon atoms, R' represents an alkyl group having 1 to 4 carbon atoms, and a is 0 or 1), a partial hydrolysate of the alkoxysilane compound, and an alkoxy group-containing silicone having a substituted or unsubstituted organic group having 6 to 12 carbon atoms. Examples of the silane compound include hexyltrimethoxysilane, hexyltriethoxysilane, octyltrimethoxysilane, octyltriethoxysilane, decyltrimethoxysilane, decyltriethoxysilane, dodecyltrimethoxysilane, and dodecyltriethoxysilane. The silane compounds may be used individually or in combinations of two or more.

The thermally conductive liquid composition of the present invention may contain components other than the above as needed. For example, a heat resistance improver such as colcothar, titanium oxide or cerium oxide, a flame retardant auxiliary, and a curing retarder may be added. For coloring and toning, an organic or inorganic pigment may be added.

It is preferred that the thermally conductive liquid composition of the present invention is in the form of a gel, putty, or grease. The gel, putty, or grease is suitable as a thermal interface material (TIM) that enhances adhesion between a heat generating member (e.g., semiconductor) and a heat dissipating material to transfer heat.

The thermally conductive liquid composition is preferably loaded in a container. As the container, various containers such as a pail, a syringe, and a cartridge can be used.

The thermally conductive inorganic particles (B) are preferably inorganic powder of alumina (aluminum oxide), zinc oxide, silicon oxide, silicon carbide, aluminum nitride, boron nitride, etc. Among these, alumina (aluminium oxide) is inexpensive and maintains the fluidity. The amount of alumina (aluminium oxide) is preferably 15 parts by mass or more with respect to 100 parts by mass of the thermally conductive inorganic particles (B). Aluminum nitride has high thermal conductivity but is expensive and lowers the fluidity as compared with alumina. The amount of aluminum nitride is preferably less than 85 parts by mass with respect to 100 parts by mass of the thermally conductive inorganic particles (B). The shape of the thermally conductive filler may be, but is not particularly limited to, spherical, amorphous, needle-like, or plate-like.

Examples of the aluminium oxide include, but are not particularly limited to, spherical alumina produced by heat melting, sintered alumina produced by firing in a kiln, electrofused alumina produced by melting in an electric arc furnace, and high purity alumina produced by hydrolysis of aluminum alkoxide, in-situ chemical vapor deposition, or the like. The obtained aluminum oxide particles may be, for example, pulverized into a particle diameter of a target range.

Examples of the aluminum nitride include, but are not particularly limited to, aluminum nitride produced by direct nitriding, reduction nitriding, combustion synthesis or the like, and coagulated aluminum nitride produced by coagulating the obtained aluminum nitride. The obtained aluminum nitride particles may be, for example, pulverized into a particle diameter of a target range.

EXAMPLES

Hereinafter, the present invention will be described by way of examples. However, the present invention is not limited to the following examples. Various parameters were measured according to the methods described below.

<Particle Size Distribution Measurement>

The volume-based cumulative distribution curve, volume-based frequency distribution curve, median diameter (D50), and peak particle diameter of commercially available thermally conductive inorganic particles were determined using a laser scattering type particle size distribution analyzer MT3300EXII manufactured by MicrotracBEL Corporation, by immersing the thermally conductive inorganic particles into water or ethanol and dispersing them by an ultrasonic homogenizer US-600E manufactured by NIHON-SEIKI KAISHA LTD., at 100% output for 60 seconds.

<Thermal Conductivity>

Figure 1B:
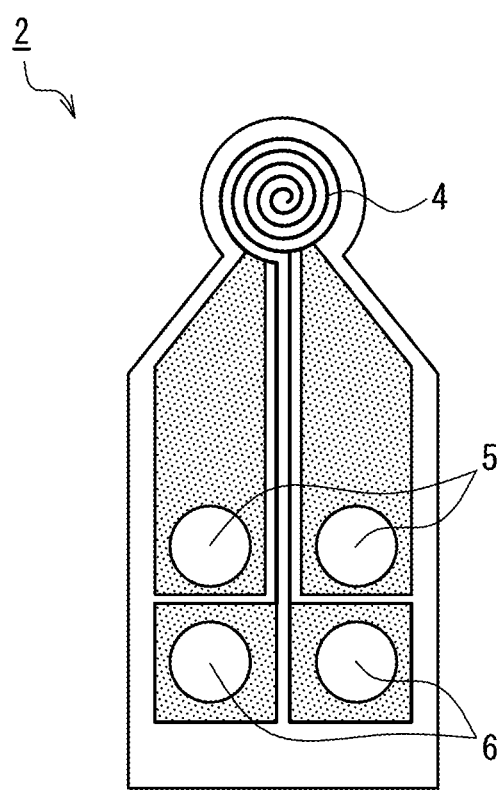
Figure 2:
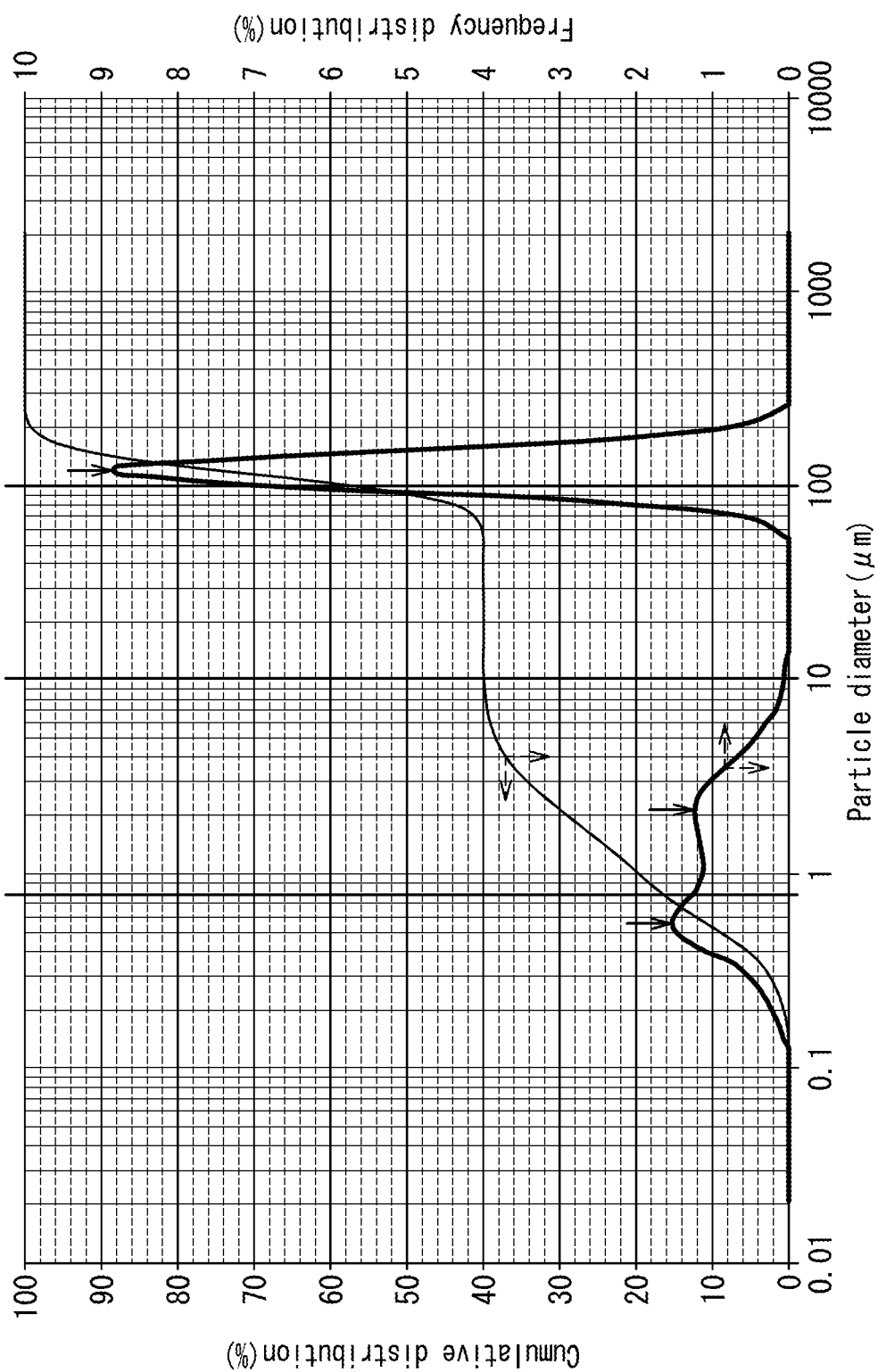
FIG. 2 is a graph showing a volume-based cumulative distribution curve and a volume-based frequency distribution curve of a sample of Example 1 of the present invention.
Figure 3:
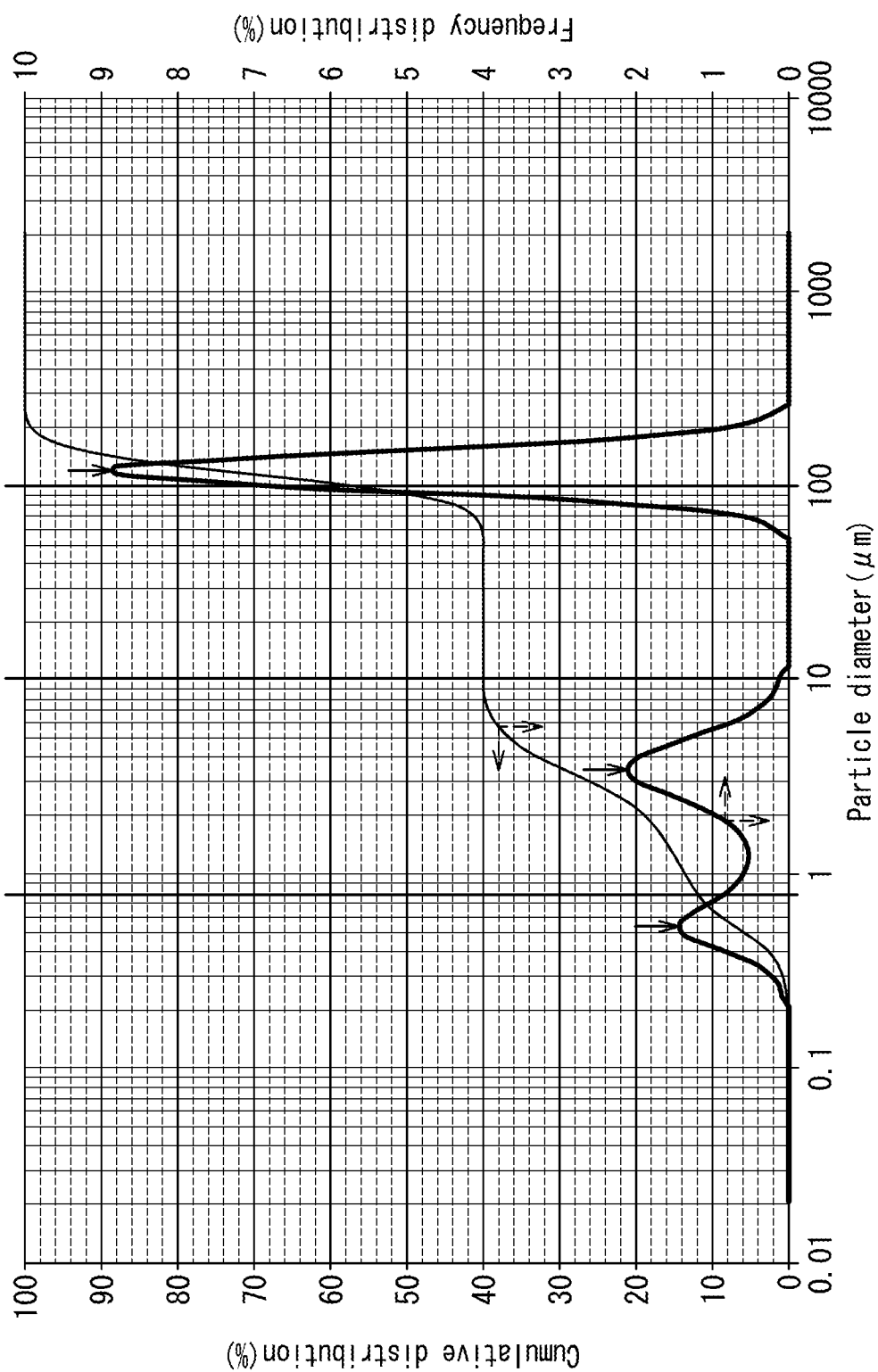
FIG. 3 is a graph showing a volume-based cumulative distribution curve and a volume-based frequency distribution curve of a sample of Example 2 of the present invention.
Figure 4:
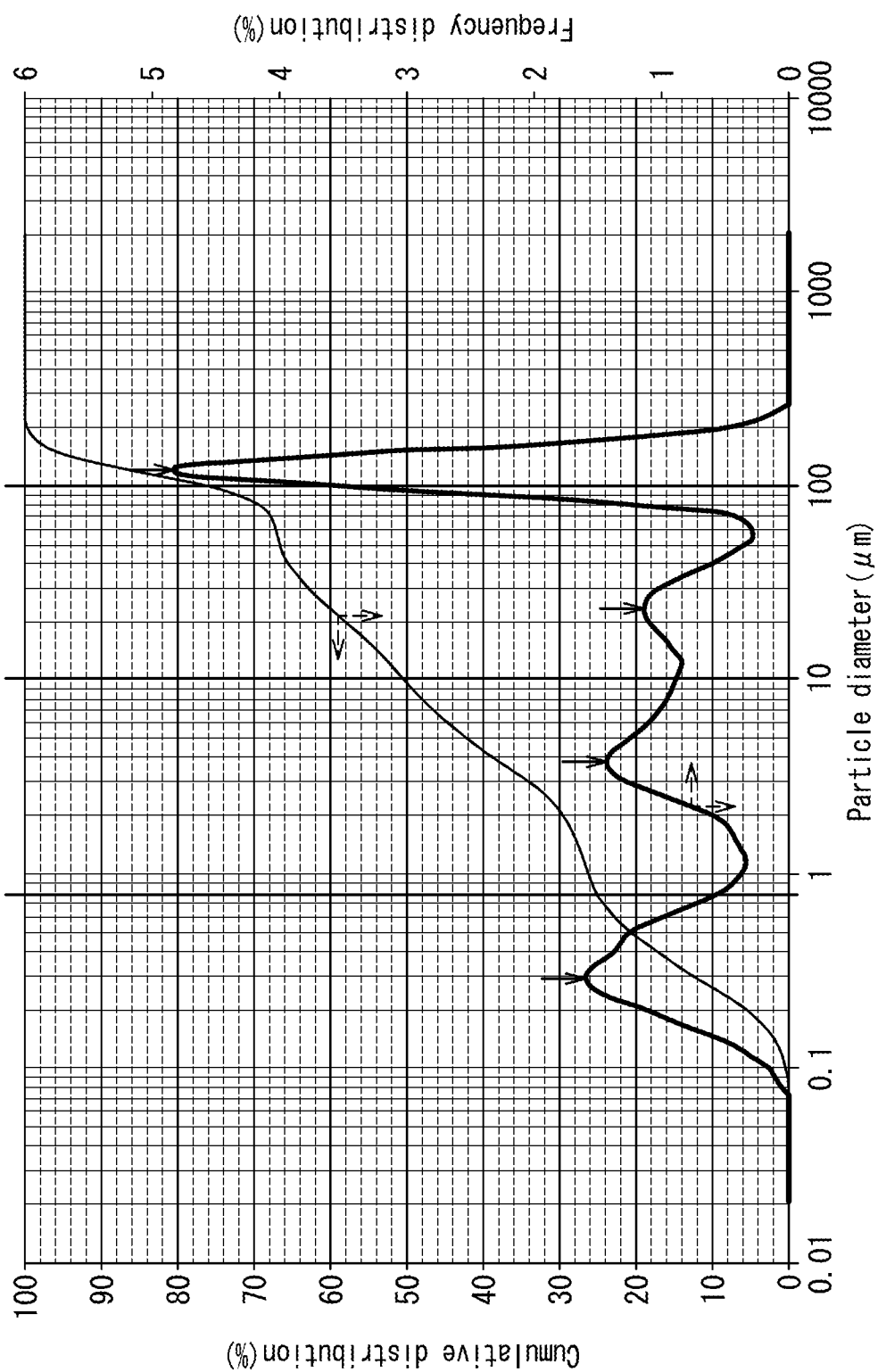
FIG. 4 is a graph showing a volume-based cumulative distribution curve and a volume-based frequency distribution curve of a sample of Example 3 of the present invention.
Figure 5:
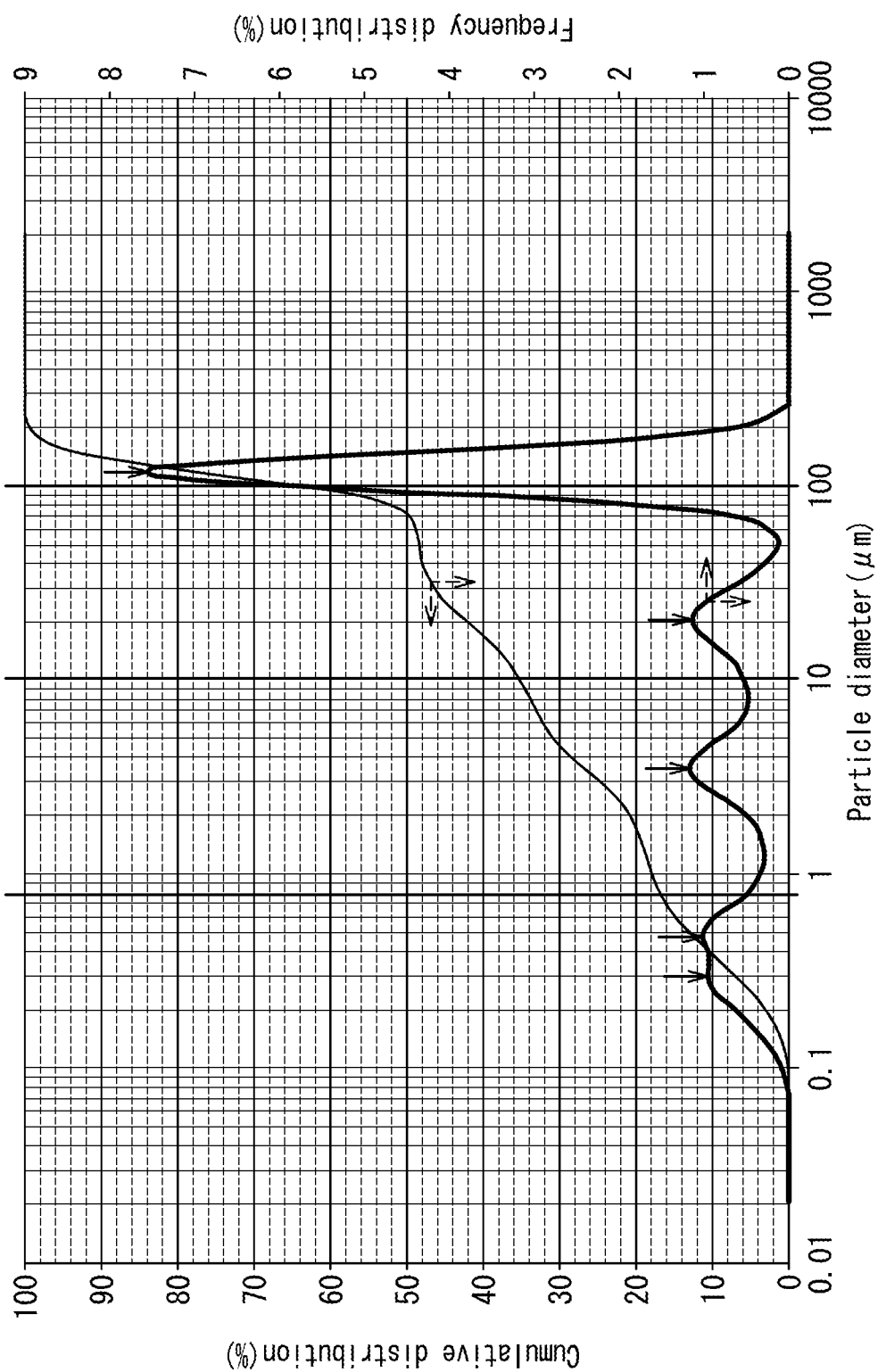
FIG. 5 is a graph showing a volume-based cumulative distribution curve and a volume-based frequency distribution curve of a sample of Example 4 of the present invention.
Figure 6:
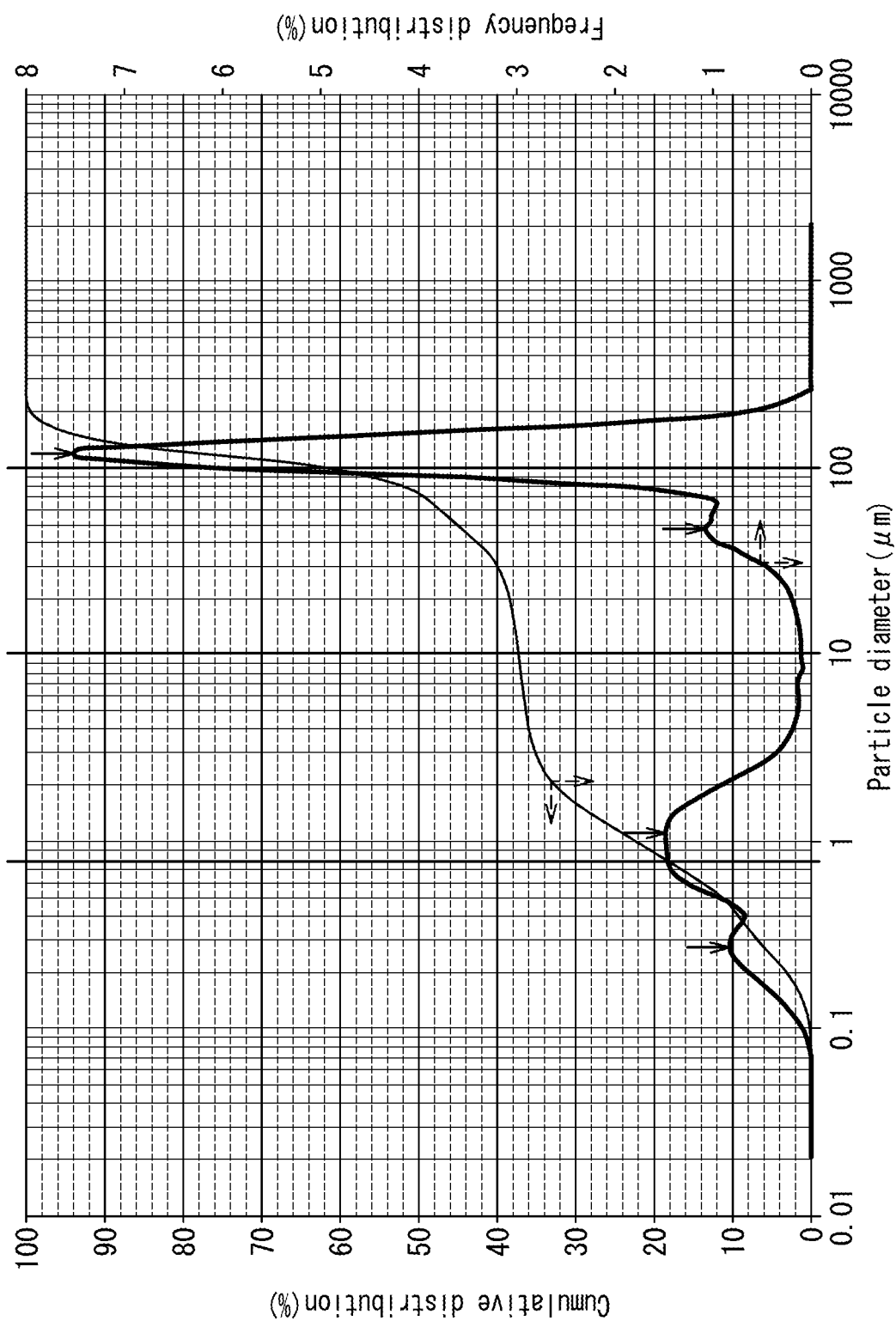
FIG. 6 is a graph showing a volume-based cumulative distribution curve and a volume-based frequency distribution curve of a sample of Example 5 of the present invention.
Figure 7:
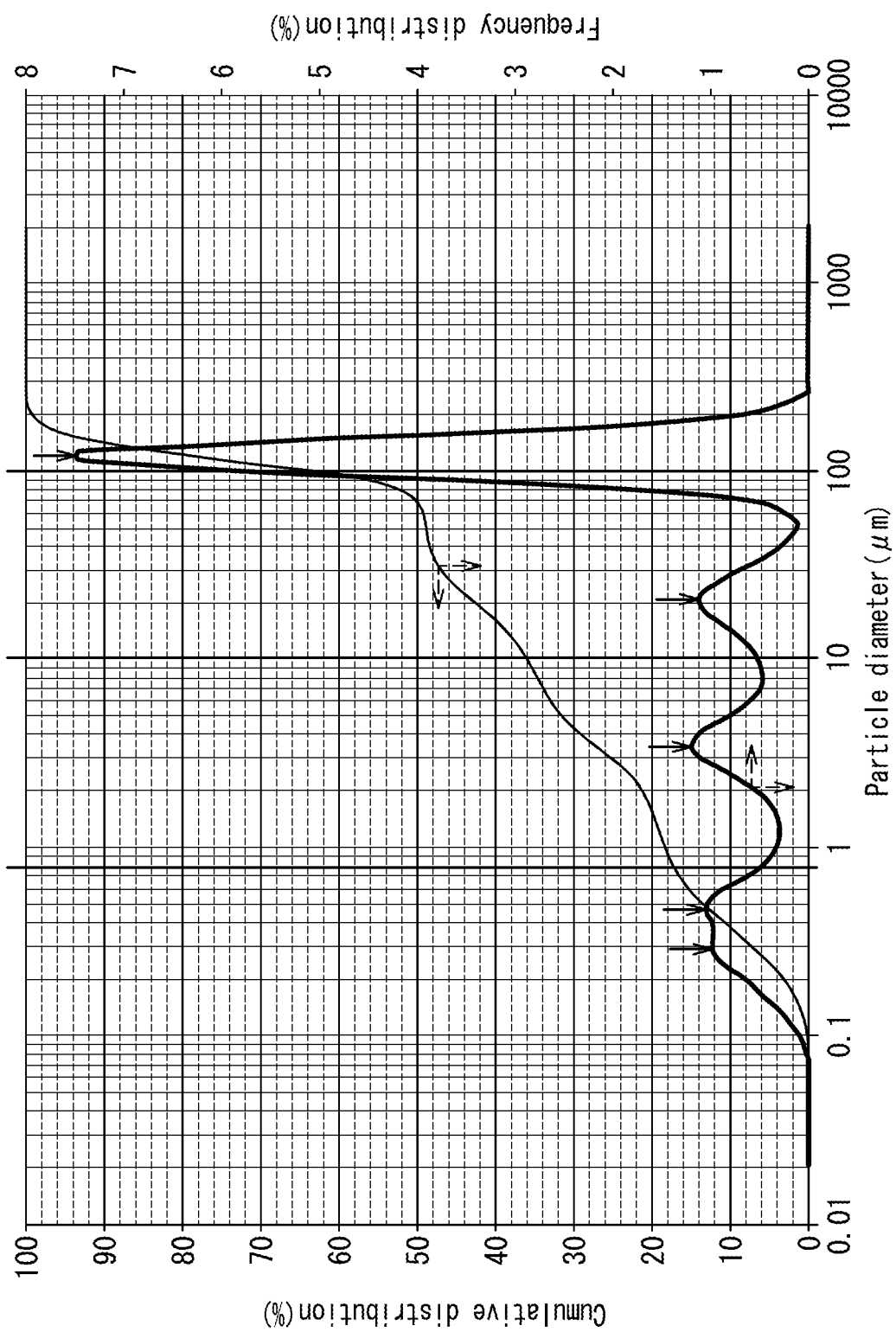
FIG. 7 is a graph showing a volume-based cumulative distribution curve and a volume-based frequency distribution curve of a sample of Example 6 of the present invention.
Figure 8:
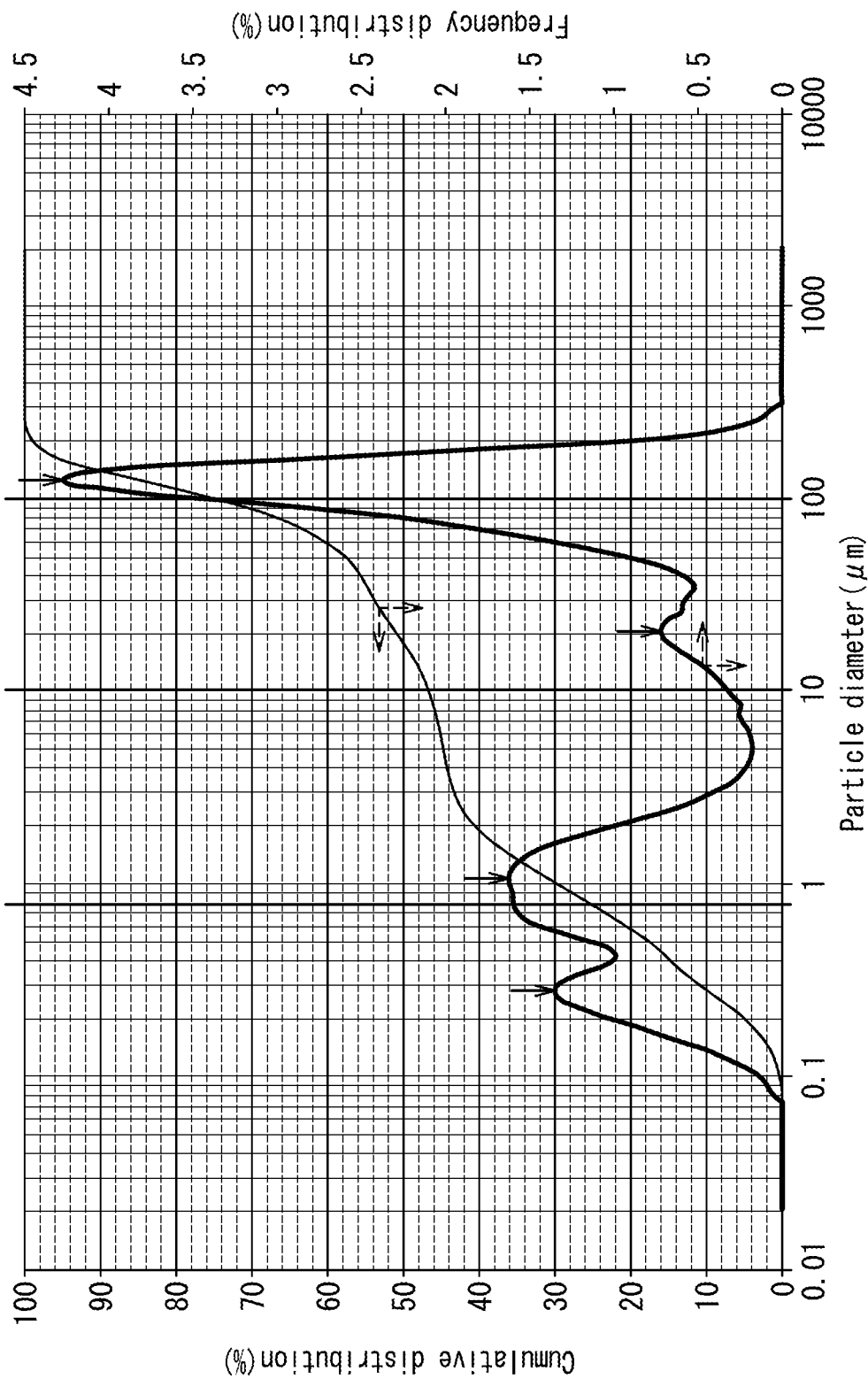
FIG. 8 is a graph showing a volume-based cumulative distribution curve and a volume-based frequency distribution curve of a sample of Example 7 of the present invention.
Figure 9:
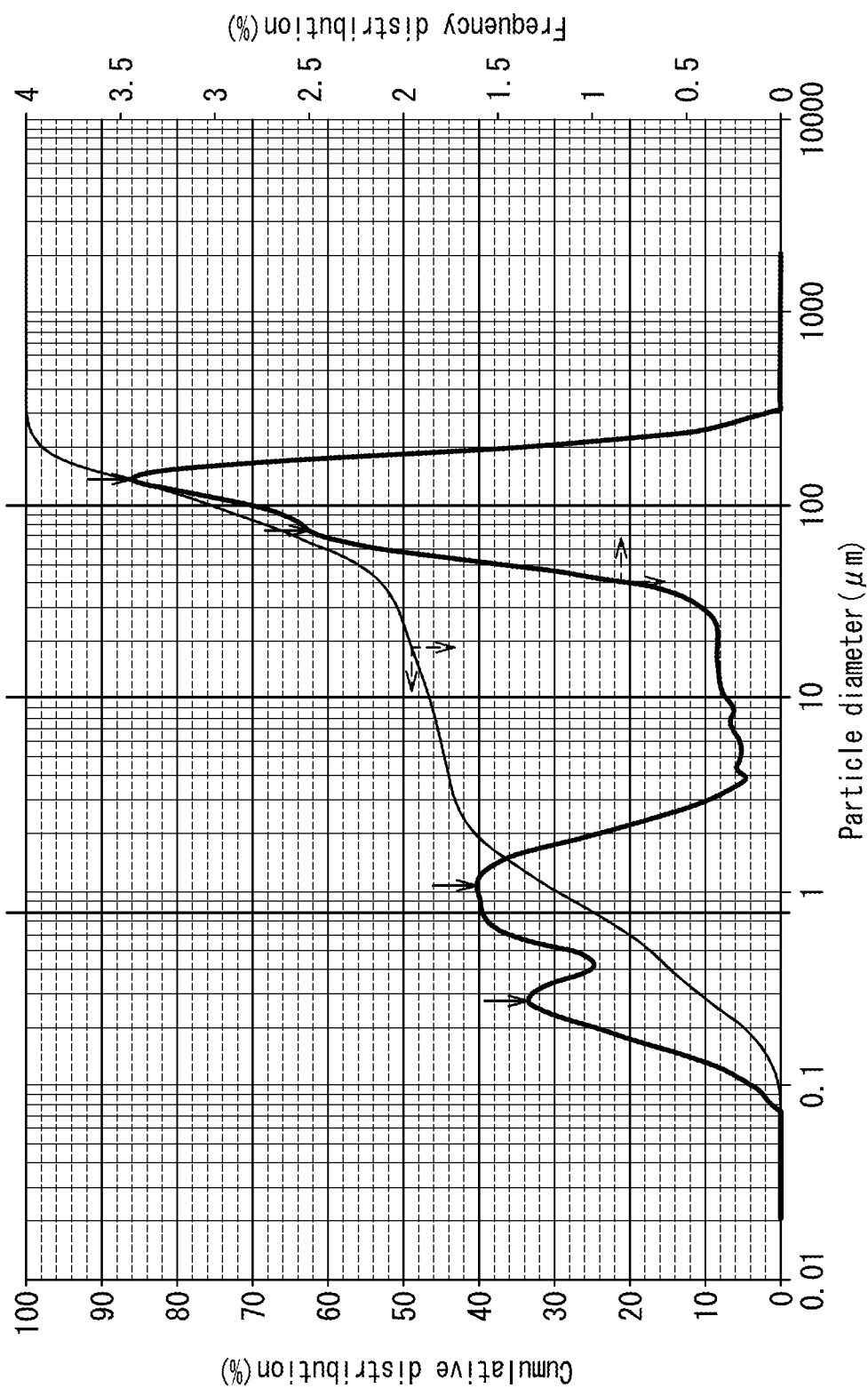
FIG. 9 is a graph showing a volume-based cumulative distribution curve and a volume-based frequency distribution curve of a sample of Example 8 of the present invention.
Figure 10:
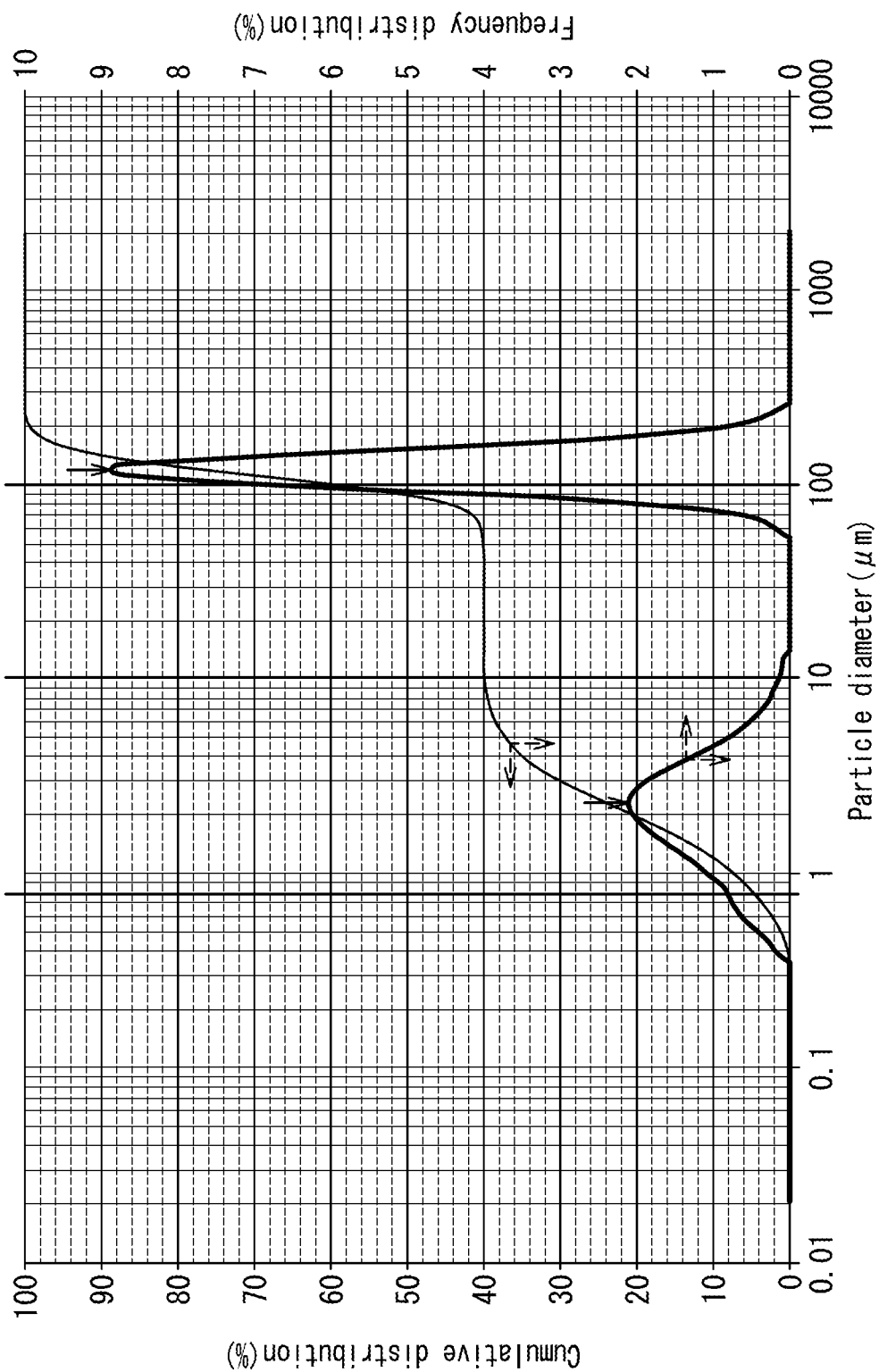
FIG. 10 is a graph showing a volume-based cumulative distribution curve and a volume-based frequency distribution curve of a sample of Comparative Example 1.
Figure 11:
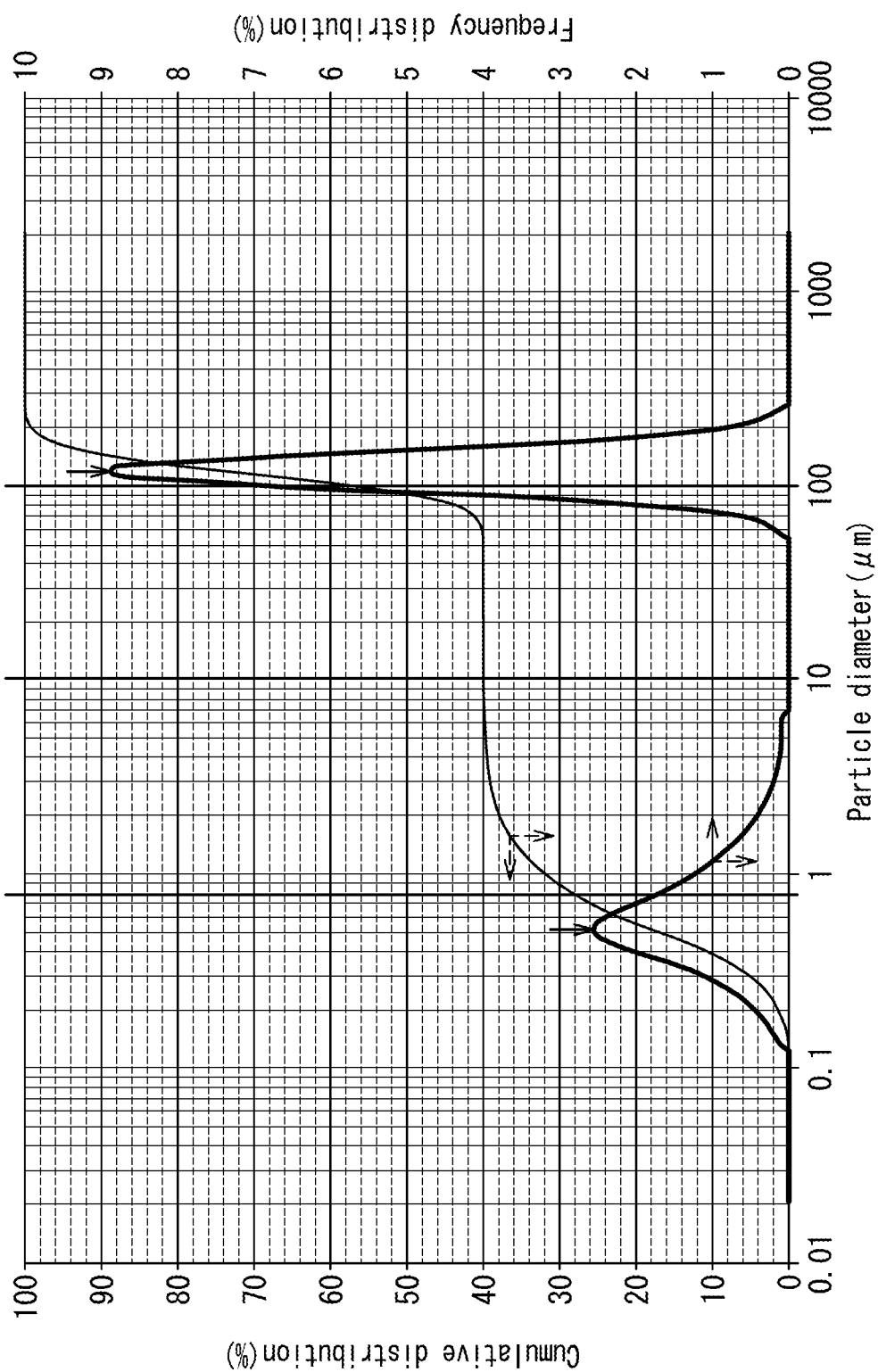
FIG. 11 is a graph showing a volume-based cumulative distribution curve and a volume-based frequency distribution curve of a sample of Comparative Example 2.
Figure 12:
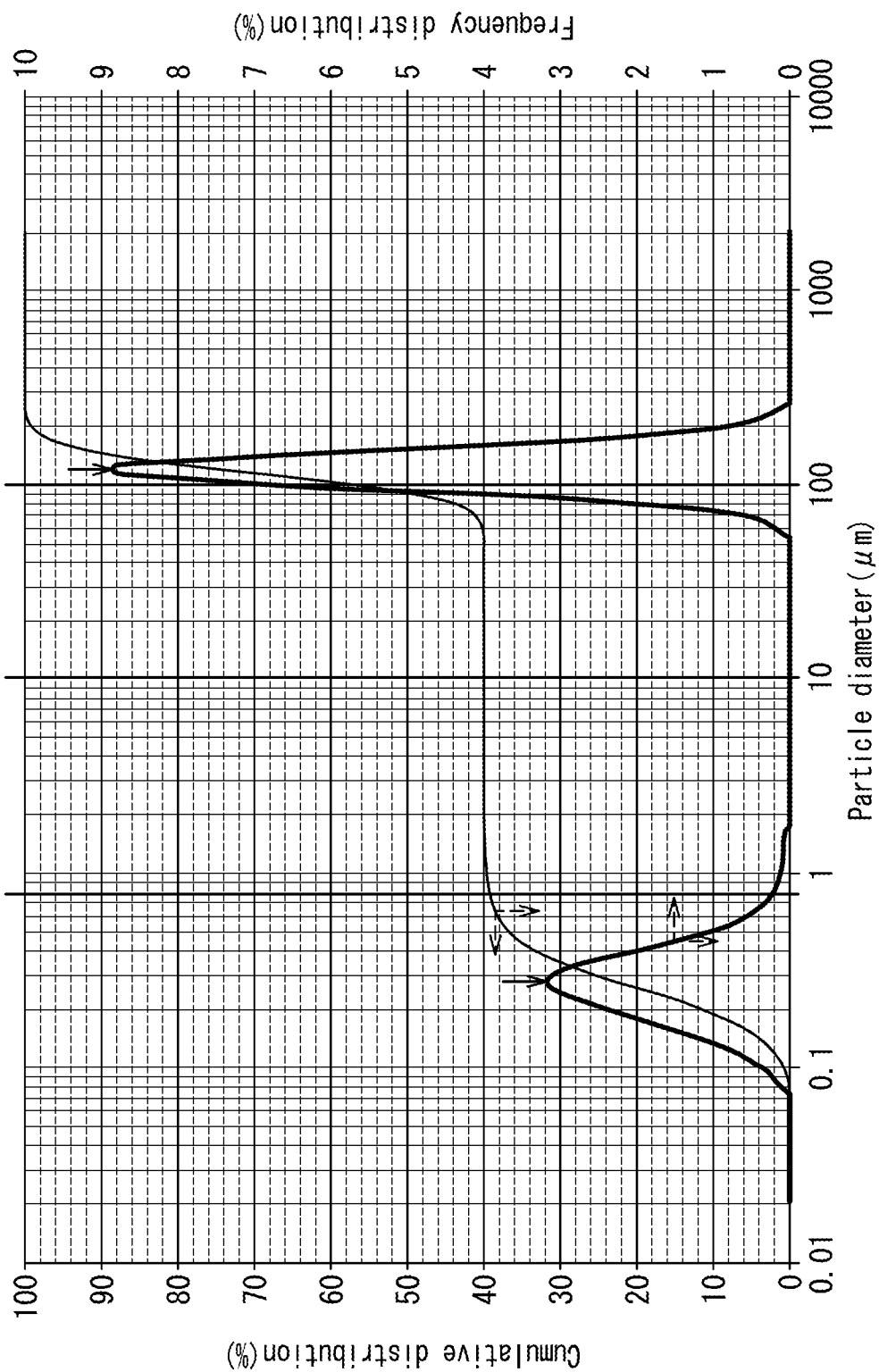
FIG. 12 is a graph showing a volume-based cumulative distribution curve and a volume-based frequency distribution curve of a sample of Comparative Example 3.
Figure 13:
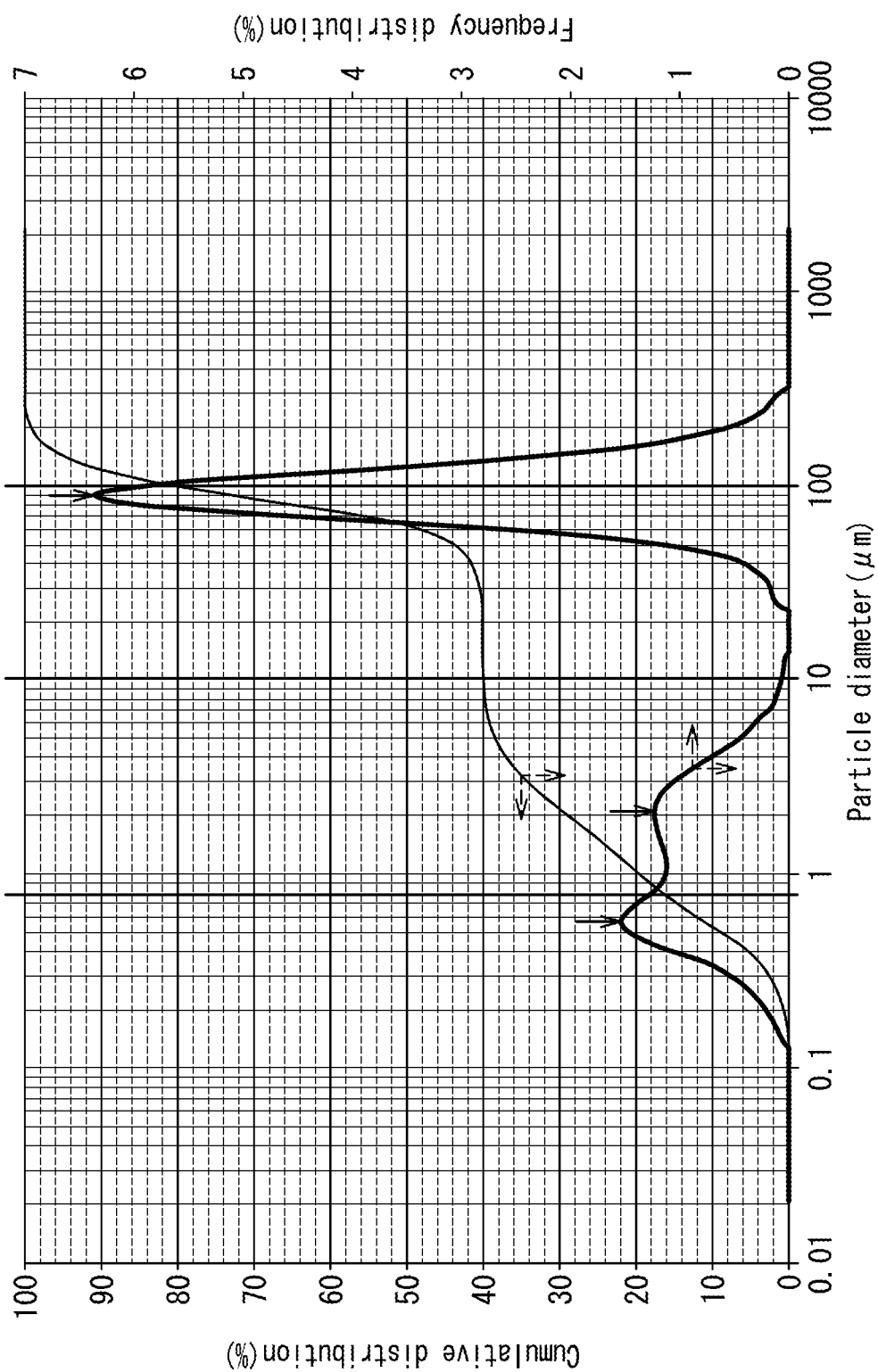
FIG. 13 is a graph showing a volume-based cumulative distribution curve and a volume-based frequency distribution curve of a sample of Comparative Example 4.
Figure 14:
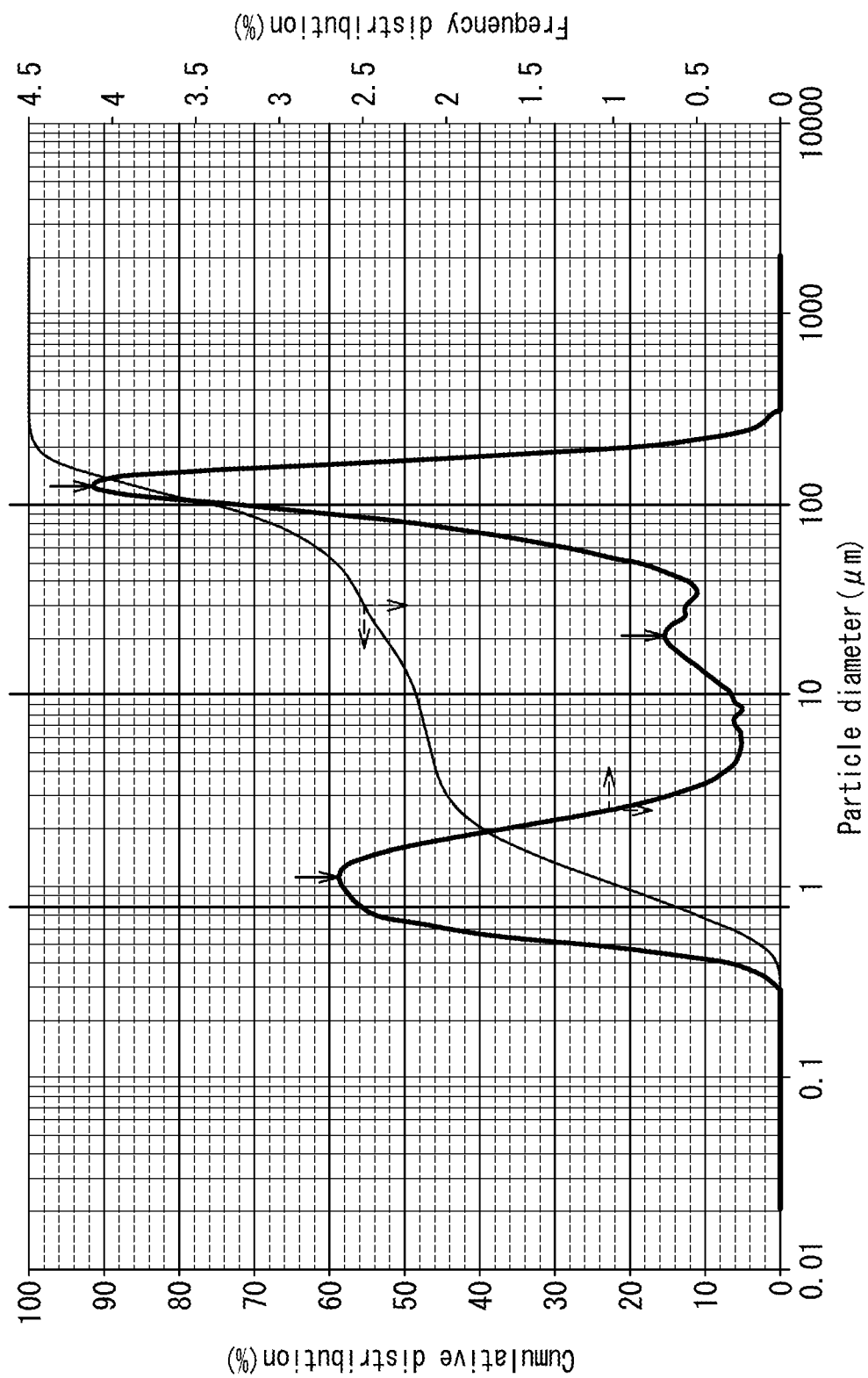
FIG. 14 is a graph showing a volume-based cumulative distribution curve and a volume-based frequency distribution curve of a sample of Comparative Example 5.

The thermal conductivity of a thermally conductive grease was measured by a hot disk (in accordance with ISO/CD 22007-2). As illustrated in FIG. 1A, using a thermal conductivity measuring apparatus 1, a polyimide film sensor 2 was sandwiched between two samples 3a and 3b, and constant power was applied to the sensor 2 to generate a certain amount of heat. Then, the thermal characteristics were analyzed from the value of a temperature rise of the sensor 2. The sensor 2 has a tip 4 with a diameter of 7 mm. As shown in FIG. 1B, the tip 4 has a double spiral structure of electrodes. An electrode 5 for an applied current and an electrode 6 for a resistance value (temperature measurement electrode) are located on the lower portion of the sensor 2. Measurement samples can be prepared by rolling a defoamed thermally conductive liquid composition into a thickness of 7 mm or more. The thermal conductivity is calculated by the following formula (1).

$$\lambda = \frac{P_0 \cdot D(\tau)}{\pi^{3/2} \cdot r} \cdot \frac{D(\tau)}{\Delta T(\tau)} \quad \text{[Formula 1]}$$

λ: Thermal conductivity (W/m·K)
$P_0$: Constant power (W)
r: Radius of sensor (m)
τ: $\sqrt{\alpha \cdot t / r^2}$
α: Thermal diffusivity of sample (m²/s)
t: Measuring time (s)
D(τ): Dimensionless function of τ
ΔT(τ): Temperature rise of sensor (K)

<Viscosity of Thermally Conductive Liquid Composition>

The viscosity of the thermally conductive liquid composition at 23° C. was measured by a HAAKE MARS III rheometer manufactured by Thermo Fisher Scientific under the following conditions: plate, P20 Ti L; measurement gap, 1.0 mm; and rotational speed, 1 rpm to 0.01 rpm. For highly viscous thermally conductive liquid compositions that tend to slip during measurement, the rotational speed is set low.

<Extrudability of Thermally Conductive Liquid Composition>

The amount of the thermally conductive liquid composition extruded through a needle for 100 seconds of discharge was measured under a discharge pressure of 0.5 MPa at 23° C. using needles of different diameters (inner diameters) each attached to a 30 mL syringe PSY-30F manufactured by Musashi Engineering, Inc. In the measurement of diameter (φ) 2.5 mm, no needle was attached to the syringe. The following needles were used.

Diameter (φ) 2.27 mm: SNA-12G-C (manufactured by Musashi Engineering, Inc.)
Diameter (φ) 1.43 mm: PN-15G-B (manufactured by Musashi Engineering, Inc.)
Diameter (φ) 0.97 mm: PN-18G-B (manufactured by Musashi Engineering, Inc.)

Examples 1 to 8

(1) Material Components

Matrix resin (A): A commercially available dimethyl silicone oil (viscosity, 300 mPa·s) and decyltrimethoxysilane as a plasticizer were used.

Thermally conductive inorganic particles (B): Thermally conductive inorganic particles shown in Table 1 were used in the proportions shown in Table 1.

The proportions are expressed by the median diameter (D50) in accordance with commercially available thermally conductive inorganic particles, which are generally expressed by the median diameter (D50).

(2) Mixture

The material components were placed in a planetary mixer and mixed for 10 minutes at 23° C. Thermally conductive liquid compositions too viscous to be dispersed homogeneously with a planetary mixer were kneaded further with a twin roll. Table 1 summarizes the properties of the resultant thermally conductive liquid compositions. FIGS. 2 to 9 are graphs showing the volume-based cumulative distribution curve and the volume-based frequency distribution curve of the samples of Examples 1 to 8.

TABLE 1

|   |   |   | Ex. 1 | Ex. 2 | Ex. 3 | Ex. 4 | Ex. 5 | Ex. 6 | Ex. 7 | Ex. 8 |
|---|---|---|---|---|---|---|---|---|---|---|
| A | Dimethyl silicone oil (g) | | 95 | 95 | 95 | 95 | 95 | 95 | 95 | 95 |
| Plasticizer | Decyltrimethoxysilane (g) | | 5 | 5 | 5 | 5 | 5 | 5 | 5 | 5 |
| B | D50: 115 μm spherical alumina (g) | | 1080 | 1080 | 600 | 950 | 950 | 1150 | — | — |
| | D50: 108 μm aluminum nitride produced by direct nitriding (g) | | — | — | — | — | — | — | 650 | — |
| | D50: 90 μm coagulated aluminum nitride (g) | | — | — | — | — | — | — | — | 800 |
| | D50: 35 μm spherical alumina (g) | | — | — | — | — | 250 | — | — | — |
| | D50: 18 μm aluminum nitride produced by direct nitriding (g) | | — | — | — | 250 | — | 250 | 150 | — |
| | D50: 15 μm aluminum nitride produced by direct nitriding (g) | | — | — | 400 | — | — | — | — | — |
| | D50: 2.0 μm sintered alumina (g) | | 360 | — | — | — | — | — | — | — |
| | D50: 2.2 μm sintered alumina (g) | | — | 720 | 400 | 400 | — | 500 | — | — |
| | D50: 1.1 μm aluminum nitride produced by reduction nitriding (g) | | — | — | — | — | 400 | — | 400 | 400 |
| | D50: 0.6 μm sintered alumina (g) | | 360 | — | — | — | — | — | — | — |
| | D50: 0.3 μm high purity alumina (g) | | — | — | 350 | 200 | 200 | 250 | 300 | 300 |
| Proportion (vol %)*¹ | 100 μm- | B1 | 46.8 | 46.8 | 25.5 | 39.9 | 39.7 | 39.5 | 27.6 | 25.8 |
| | 10-100 μm | B2-3 | 13.4 | 13.4 | 25.1 | 25.4 | 23.1 | 25.0 | 26.2 | 27.9 |
| | 0.8-10 μm | B2-1 | 24.1 | 28.7 | 24.7 | 18.2 | 19.8 | 18.6 | 22.2 | 22.2 |
| | 0.01-0.8 μm | B2-2 | 15.7 | 11.1 | 24.7 | 16.5 | 17.4 | 16.9 | 24.1 | 24.1 |
| Ratio of (B2-1) (vol %)*² | | | 60.6 | 72.1 | 50.0 | 52.4 | 53.2 | 52.4 | 47.9 | 48.0 |
| Blended ratio of B (mass %) | | | 94.7 | 94.7 | 94.6 | 94.7 | 94.7 | 95.7 | 93.8 | 93.8 |
| Proportion of aluminium oxide (mass %) | | | 100 | 100 | 77.1 | 86.1 | 77.8 | 86.4 | 20.0 | 20.0 |
| Thermal conductivity (W/mK) | | | 6.8 | 6.4 | 6.9 | 7.2 | 8.2 | 8.8 | 11.1 | 10.9 |
| Rheometer viscosity (Pa · s) | | | 92400 | 20500 | 48700 | 10600 | 11700 | 38900 | 18800 | 93900 |

TABLE 1-continued

|  |  | Ex. 1 | Ex. 2 | Ex. 3 | Ex. 4 | Ex. 5 | Ex. 6 | Ex. 7 | Ex. 8 |
|---|---|---|---|---|---|---|---|---|---|
| Extrudability*3 | φ 2.5 mm | 0.21 | 6.12 | 2.38 | 61.45 | 8.54 | 1.12 | 5.33 | 0.11 |
| (g/100 sec) | φ 2.27 mm | 0.03 | 1.12 | 0.09 | 8.35 | 1.07 | 0.07 | 0.49 | 0.00 |
|  | φ 1.43 mm | 0.00 | 0.16 | 0.01 | 1.11 | 0.16 | 0.00 | 0.02 | 0.00 |
|  | φ 0.97 mm | 0.00 | 0.03 | 0.00 | 0.27 | 0.03 | 0.00 | 0.00 | 0.00 |

(Note)*1:
Proportion based on 100 vol% of filler
(Note)*2:
Ratio calculated from Formula (1): [(B2-1)/((B2-1) + (B2-2)] xx 100
(Note)*3:
None of the compositions caused syringe breakage by 100 seconds of discharge,
*Ex. Example Comparative Examples 1 to 5

The thermally conductive liquid compositions of Comparative Examples 1 to 5 were produced in the same manner as in Example 1 except for the proportions of the thermally conductive inorganic particles (B) as shown in Table 2. FIGS. 10 to 14 are graphs showing the volume-based cumulative distribution curve and the volume-based frequency distribution curve of the samples of Comparative Examples 1 to 5.

breakage of the syringe. Some of the thermally conductive liquid compositions were extrudable from the discharge orifices of 0.97 mm, 1.43 mm, and 2.27 mm in diameter. The thermally conductive liquid compositions extrudable from a discharge orifice of such a small diameter mean that they can be applied with high precision and practically very useful.

Example 9

Example 9 is an example in which the composition of Example 4 was cured. A commercially available two-part

TABLE 2

|  |  | Comp. Ex.1 | Comp. Ex.2 | Comp. Ex.3 | Comp. Ex.4 | Comp. Ex.5 |
|---|---|---|---|---|---|---|
| A | Dimethyl silicone oil (g) | 95 | 95 | 95 | 95 | 95 |
| Plasticizer | Decyltrimethoxysilane (g) | 5 | 5 | 5 | 5 | 5 |
| B | D50: 115 µm spherical alumina (g) | 1080 | 1080 | 1080 | — | — |
|  | D50: 108 µm aluminum nitride produced by direct nitriding (g) | — | — | — | — | 650 |
|  | D50: 75 µm spherical alumina (g) | — | — | — | 1080 | — |
|  | D50: 35 µm spherical alumina (g) | — | — | — | — | — |
|  | D50: 18 µm aluminum nitride produced by direct nitriding (g) | — | — | — | — | 150 |
|  | D50: 15 µm aluminum nitride produced by direct nitriding (g) | — | — | — | — | — |
|  | D50: 2.0 µm sintered alumina (g) | 720 | — | — | 360 | — |
|  | D50: 2.2 µm sintered alumina (g) | — | — | — | — | — |
|  | D50: 1 µm aluminum nitride produced by reduction nitriding (g) | — | — | — | — | 700 |
|  | D50: 0.6 µm sintered alumina (g) | — | 720 | — | 360 | — |
|  | D50: 0.3 µm high purity alumina (g) | — | — | 720 | — | — |
| Proportion | 100 µm- B1 | 46.8 | 46.8 | 20.7 | 20.7 | 26.5 |
| (vol %)*1 | 10-100 µm B2-3 | 13.6 | 13.2 | 39.3 | 39.5 | 25.3 |
|  | 0.8-10 µm B2-1 | 35.4 | 12.7 | 1.0 | 24.1 | 35.5 |
|  | 0.01-0.8 µm B2-2 | 4.2 | 27.3 | 39.0 | 15.7 | 12.7 |
| Ratio of (B2-1) (vol %)*2 |  | 89.4 | 31.4 | 2.4 | 60.5 | 73.7 |
| Blended ratio of B (mass %) |  | 94.7 | 94.7 | 94.7 | 94.7 | 93.8 |
| Proportion of aluminium oxide (mass %) |  | 100 | 100 | 100 | 100 | 0 |
| Thermal conductivity (W/mK) |  |  |  |  | 6.9 |  |
| Rheometer viscosity (Pa · s) |  | Could not be loaded | Could not be loaded | Could not be loaded | 798100 | Could not be loaded |
| Extrudability | φ 2.5 mm | — | — | — | 0.00 | — |
| (g/100 sec)*3 | φ 2.27 mm | — | — | — | 0.00 | — |
|  | φ 1.43 mm | — | — | — | 0.00 | — |
|  | φ 0.97 mm | — | — | — | 0.00 | — |

(Note)*1: Proportion based on 100 vol % of filler
(Note)*2: Ratio calculated from Formula (1): [(B2-1)/{(B2-1) + (B2-2)}] × 100
(Note)*3:
None of the compositions caused syringe breakage by 100 seconds of discharge
*Comp. Ex.: Comparative Example According to the above results, the thermally conductive liquid compositions of Examples 0.1 to 8 loaded in a syringe were extrudable in an amount of 0.1 g or more for 100 seconds from a discharge orifice of 2.5 mm in diameter under a discharge pressure of 0.5 MPa at 23° C., without addition curable silicone polymer was used as an organic matrix resin. The two-part addition curable silicone polymer is composed of a solution A and a solution B. The solution A contains an organopolysiloxane having two or more alkenyl groups per molecule and a platinum group metal-containing curing catalyst. The solution B contains an organopolysiloxane component having two or more alkenyl groups per molecule, an organohydrogenpolysiloxane component having two or more hydrogen atoms bonded directly to silicon atoms, and a curing retarder. The solution A has a viscosity of 300 mPa·s, and the solution B has a viscosity of 300 mPa·s.

The above two-part addition curable silicone polymer was used as an organic matrix resin, and the others were the same as the composition of Example 4. The material components were placed in a planetary mixer and mixed for 10 minutes at 23° C. The thermally conductive liquid composition was too viscous to be dispersed homogeneously with a planetary mixer and kneaded further with a twin roll. The thermally conductive liquid composition was rolled into a 3-mm-thick sheet with a constant velocity roller and cured in a hot air circulating oven at 100° C. for 10 minutes. The Shore OO hardness of the obtained cured sheet was measured.

Comparative Example 6

Comparative Example 6 is an example in which the composition of Comparative Example 4 was cured. The others were performed in the same manner as in Example 9. Owing to its high viscosity, the composition of Comparative Example 6 was hard to make flat and poor in rollability.

Table 3 summarizes the rollability and the hardness of the compositions of Example 9 and Comparative Example 6. The composition of Example 9 was less viscous than the composition of Comparative Example 6 and better in rollability.

TABLE 3

|  | Example 9 | Comparative Example 6 |
|---|---|---|
| Rollability | Good | Poor |
| Hardness | 60 | 85 |

INDUSTRIAL APPLICABILITY

The thermally conductive liquid composition of the present invention is suitable to be interposed between a heat generating member and a heat dissipating material of electrical and electronic components or the like.

DESCRIPTION OF REFERENCE NUMERALS

1 Thermal conductivity measuring apparatus
2 Sensor
3a, 3b Sample
4 Tip of the sensor
5 Electrode for applied current
6 Electrode for resistance value (temperature measurement electrode)

The invention claimed is:
1. A thermally conductive liquid composition comprising a matrix resin (A) and thermally conductive inorganic particles (B),
wherein the matrix resin (A) accounts for 2% by mass or more and 8% by mass or less and the thermally conductive inorganic particles (B) account for 92% by mass or more and 98% by mass or less relative to 100% by mass of the thermally conductive liquid composition; wherein:
the matrix resin (A) is an uncured organopolysiloxane;
the thermally conductive liquid composition comprises a plasticizer in an amount of more than 0 parts by mass and 200 parts by mass or less with respect to 100 parts by mass of the matrix resin (A);
the plasticizer is an alkoxysilane compound expressed by $R_a Si(OR')_{4-a}$, where R represents a substituted or unsubstituted organic group having 6 to 12 carbon atoms, R' represents an alkyl group having 1 to 4 carbon atoms, and a is 0 or 1, or a partial hydrolysate of the alkoxysilane compound;
the thermally conductive inorganic particles (B) comprise thermally conductive inorganic particles (B1) with a median diameter D50 of 100 μm or more and 500 μm or less and thermally conductive inorganic particles (B2) with a median diameter D50 of 0.01 μm or more and less than 100 μm,
when the thermally conductive inorganic particles (B) are expressed in a volume-based cumulative distribution curve, the thermally conductive inorganic particles (B1) account for 25% by volume or more and 50% by volume or less and the thermally conductive inorganic particles (B2) account for 50% by volume or more and 75% by volume or less relative to 100% by volume of the thermally conductive inorganic particles (B),
the thermally conductive inorganic particles (B) are composed of at least one selected from the group consisting of aluminum oxide and aluminum nitride, and an amount of the aluminum oxide is 15 parts by mass or more and an amount of the aluminum nitride is less than 85 parts by mass with respect to 100 parts by mass of the thermally conductive inorganic particles (B),
the thermally conductive liquid composition has both viscous and elastic characteristics, and has a viscosity of 3000 Pas or more and 100000 Pas or less at 23° C. according to a rheometer, and
the thermally conductive liquid composition loaded in a syringe is extrudable in an amount of 0.1 g or more for 100 seconds from a discharge orifice 2.5 mm in diameter under a discharge pressure of 0.5 MPa at 23° C., without breakage of the syringe.

2. The thermally conductive liquid composition according to claim 1, wherein the thermally conductive liquid composition has a thermal conductivity of 5.0 to 16.0 W/mK.

3. The thermally conductive liquid composition according to claim 1,
wherein the thermally conductive inorganic particles (B2) comprise thermally conductive inorganic particles (B2-1) of 0.8 μm or more and less than 10 μm and thermally conductive inorganic particles (B2-2) of 0.01 μm or more and less than 0.8 μm, and
a ratio between the thermally conductive inorganic particles (B2-1) and the thermally conductive inorganic particles (B2-2) determined by $[(B2\text{-}1)/\{(B2\text{-}1)+(B2\text{-}2)\}] \times 100$ is 40% by volume or more and less than 80% by volume.

4. The thermally conductive liquid composition according to claim 1, wherein when the thermally conductive inorganic particles (B) are expressed in a volume-based frequency distribution curve, the thermally conductive inorganic particles (B) have one or more peaks in each of the following ranges: from 100 μm or more and 200 μm or less, from 0.8 μm or more and less than 10 μm, and from 0.01 μm or more and less than 0.8 μm.

5. The thermally conductive liquid composition according to claim 1,
  wherein the thermally conductive inorganic particles (B2) further comprise thermally conductive inorganic particles (B2-3) of 10 μm or more and less than 100 μm, and
  in the volume-based cumulative distribution curve, the thermally conductive inorganic particles (B2-3) account for 10% by volume or more and less than 35% by volume relative to 100% by volume of the thermally conductive inorganic particles (B).

6. The thermally conductive liquid composition according to claim 1, wherein the thermally conductive liquid composition is in the form of a gel, putty, or grease.

7. The thermally conductive liquid composition according to claim 1, wherein the thermally conductive liquid composition is loaded in a container.

8. The thermally conductive liquid composition according to claim 1, wherein the thermally conductive liquid composition comprises a curing catalyst.

* * * * *